(12) United States Patent
Na et al.

(10) Patent No.: US 11,735,453 B2
(45) Date of Patent: Aug. 22, 2023

(54) SYSTEM FOR TRANSFERRING SUBSTRATE

(71) Applicant: Samsung Display Co., LTD., Yongin-si (KR)

(72) Inventors: Heungyeol Na, Suwon-si (KR); Mingyoun Kang, Siheung-si (KR); Dongwon Seol, Asan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 935 days.

(21) Appl. No.: 16/565,670

(22) Filed: Sep. 10, 2019

(65) Prior Publication Data
US 2020/0176295 A1 Jun. 4, 2020

(30) Foreign Application Priority Data
Nov. 29, 2018 (KR) ........................ 10-2018-0151053

(51) Int. Cl.
| H01L 21/67 | (2006.01) |
| H01L 21/677 | (2006.01) |
| H01L 21/68 | (2006.01) |
| H01L 21/687 | (2006.01) |
| B25J 19/02 | (2006.01) |
| G06T 7/70 | (2017.01) |
| B25J 9/16 | (2006.01) |

(52) U.S. Cl.
CPC ...... *H01L 21/67736* (2013.01); *B25J 9/1697* (2013.01); *B25J 19/023* (2013.01); *G06T 7/70* (2017.01); *H01L 21/67706* (2013.01); *H01L 21/67766* (2013.01); *H01L 21/681* (2013.01); *H01L 21/687* (2013.01); *Y10T 29/49004* (2015.01); *Y10T 29/53261* (2015.01)

(58) Field of Classification Search
CPC ......... H01L 21/67736; H01L 21/67706; H01L 21/67766; H01L 21/681; H01L 21/687; Y10T 29/49004; Y10T 29/53261; B25J 9/1697; B25J 9/023; G06T 7/70
USPC .......................................................... 29/593
See application file for complete search history.

(56) References Cited

FOREIGN PATENT DOCUMENTS

| JP | 5370774 B2 | 9/2013 |
| JP | 5370774 B2 * | 12/2013 |
| KR | 100736749 B1 | 7/2007 |
| KR | 101433516 B1 * | 8/2014 |

(Continued)

*Primary Examiner* — Peter Dungba Vo
*Assistant Examiner* — Azm A Parvez
(74) *Attorney, Agent, or Firm* — Cantor Colburn LLP

(57) ABSTRACT

A system for transferring a substrate includes a substrate transporter at which is captured a first image with which a position of the substrate at the substrate transporter is determined; a tray at which is captured a second image with which a position of each of a plurality of substrates relative to the tray is determined; a substrate mover with which the substrate is movable in a revolving manner between the substrate transporter and the tray, the substrate mover including: an arm portion movable in the revolving manner between the substrate transporter and the tray, and a substrate securing portion movable together with the arm portion; and an imager with which the first image and the second image are captured, the imager connected to the arm portion and movable in the revolving manner between the substrate transporter and the tray together with the arm portion.

10 Claims, 9 Drawing Sheets

(56) References Cited

FOREIGN PATENT DOCUMENTS

KR        101433516 B1    8/2014
KR    1020180028057 A    3/2018

* cited by examiner

SYSTEM FOR TRANSFERRING SUBSTRATE

This application claims priority to Korean Patent Application No. 10-2018-0151053, filed on Nov. 29, 2018, and all the benefits accruing therefrom under 35 U.S.C. § 119, the disclosure of which is incorporated by reference herein in its entirety.

BACKGROUND

1. Field

Embodiments of the invention relate to a system with which a substrate is transferred and a method for transferring a substrate using the system.

2. Description of the Related Art

As the demand for display devices has increased, various flat panel display devices such as liquid crystal display ("LCD") devices, plasma display panel ("PDP") devices, electro luminescent display ("ELD") devices, and vacuum fluorescent display ("VFD") devices, have been developed and used in various electronic devices. Research and development of portable display devices have been accelerated. In particular, research and development are underway to reduce the manufacturing cost of such display devices.

SUMMARY

One or more embodiment of the invention may be directed to a system with which a substrate is transferred and a method for transferring a substrate using the system, that are capable of reducing the manufacturing cost of a display device.

According to an embodiment, a system for transferring a substrate includes: a substrate transporter at which is captured a first image with which a position of the substrate at the substrate transporter is determined; a tray to which a plurality of substrates is moved from the substrate transporter and at which is captured a second image with which a position of each of the plurality of substrates relative to the tray is determined; a substrate mover with which the substrate is movable in a revolving manner between the substrate transporter and the tray, the substrate mover including: an arm portion movable in the revolving manner between the substrate transporter and the tray, and a substrate securing portion movable together with the arm portion and to which the substrate is securable; and an imager with which the first image and the second image are captured, the imager connected to the arm portion and movable in the revolving manner between the substrate transporter and the tray together with the arm portion.

The substrate transporter may include a first imaging area at which one of the substrate is disposed and at which the first image is captured by the imager, the first image including the one of the substrate disposed relative to the substrate transporter, the tray may include a second imaging area at which the plurality of substrates is disposed and at which the second image is captured by the imager, and a same one of the second image may include a portion of each of the plurality of substrates disposed relative to the tray.

A center of the second imaging area may overlap a center of the tray.

The first imaging area may have a planar area substantially equal to a planar area of the second imaging area.

The imager may maintain a substantially same focus.

Capture of the first image at the first imaging area by the imager, may dispose the substrate transporter and the imager at a first distance from each other, capture of the second image at the second imaging area by the imager, may dispose the tray and the imager at a second distance from each other, and the first distance may be equal to the second distance.

The tray may include a plurality of substrate accommodation portions respectively at which the plurality of substrates is disposed, a portion of each of the plurality of substrate accommodation portions may be disposed at the second imaging area, and the same one of the second image may include the portion of each of the plurality of substrate accommodation portions at the second imaging area disposed relative to a corresponding portion of the plurality of substrates, respectively.

Within the same one of the second image, a substrate accommodation portion among the plurality of substrate accommodation portions disposed relative to a corresponding substrate among the plurality of substrates: may dispose a first side and a second side of the substrate accommodation portion facing a first side and a second side of the corresponding substrate, respectively, the first side of the substrate accommodation portion having two end portions opposing each other, may dispose the first side of the substrate accommodation portion spaced apart from the first side of the corresponding substrate by a first distance and a second distance respectively at different points along the first side of the substrate accommodation portion and between the two end portions thereof, and may dispose the first side of the substrate accommodation portion and the second side of the corresponding substrate at an angle relative to each other.

Within the same one of the second image, the substrate accommodation portion disposed relative to the corresponding substrate may further dispose the second side of the substrate accommodation portion spaced apart from the second side of the corresponding substrate by a third distance and a fourth distance respectively at different points along the second side of the substrate accommodation portion and between two end portions thereof.

The first, second, third, and fourth distances and the angle, at which the substrate accommodation portion is disposed relative to the corresponding substrate within the same one of the second image, may determine whether the corresponding substrate is positioned at a correct position relative to the substrate accommodation portion.

According to another embodiment, a method for transferring a substrate includes: disposing a substrate on a substrate transporter which transfers the substrate toward a substrate mover; an imager capturing an image at a first imaging area of the substrate transporter, the first imaging area including the substrate disposed on the substrate transporter; the substrate mover moving the substrate which is disposed on the substrate transporter, to a tray; the imager which captures the image at the first imaging area, further capturing an image of a second imaging area of the tray, the second imaging area including a plurality of substrates moved to the tray from the substrate transporter by the substrate mover and disposed on the tray; analyzing, via a computer processor of the substrate mover, a position of each of the plurality of substrates relative to the tray within the image captured at the second imaging area; and determining, via the computer processor of the substrate mover, whether or not the position of each of the plurality of substrates relative to the tray within the image captured at the second imaging area is a correct position of the plurality of substrates relative to the tray.

The substrate mover moving the substrate which is disposed on the substrate transporter, to the tray, may include: securing the substrate which is disposed on the substrate transporter, to a substrate securing portion of the substrate mover; an arm portion connected to the substrate securing portion and moving together with the substrate securing portion having the substrate secured thereto, toward the tray from the substrate transporter; and detaching the substrate from the substrate securing portion, and disposing the substrate on the tray.

The tray may include a plurality of substrate accommodation portions respectively at which the plurality of substrates is disposed, a portion of each of the plurality of substrate accommodation portions may be disposed at the second imaging area, and a same one of the image captured at the second imaging area may include the portion of each of the plurality of substrate accommodation portions at the second imaging area disposed relative to a corresponding portion of the plurality of substrates, respectively.

Within the same one of the image captured at the second imaging area, a substrate accommodation portion among the plurality of substrate accommodation portions disposed relative to a corresponding substrate among the plurality of substrates may dispose a first side and a second side of the substrate accommodation portion facing and spaced apart from a first side and a second side of the corresponding substrate, respectively, the first side of the substrate accommodation portion having two end portions opposing each other, and the method may further include: calculating at different points along the first side of the substrate accommodation portion and between the two end portions thereof, a first distance and a second distance between the first side of the substrate accommodation portion and the first side of the corresponding substrate, and calculating an angle between the first side of the substrate accommodation portion and the second side of the substrate.

Within the same one of the image captured at the second imaging area, the substrate accommodation portion disposed relative to the corresponding substrate may further dispose the second side of the substrate accommodation portion spaced apart from the second side of the corresponding substrate, and the method may further include calculating at different points along the second side of the substrate accommodation portion and between two end portions thereof, a third distance and a fourth distance between the second side of the substrate accommodation portion and the second side of the corresponding substrate.

The imager may have a substantially same focus when the imager captures the image at the first imaging area of the substrate transporter and when the imager captures the image at the second imaging area of the tray.

The second imaging area may have a planar area less than a planar area of the tray.

A center of the second imaging area may overlap a center of the tray.

The first imaging area may have an area substantially equal to an area of the second imaging area.

A distance between the imager and the substrate transporter when the imager captures the image of the first imaging area of the substrate transporter may be substantially equal to a distance between the imager and the tray when the imager captures the image of the second imaging area of the tray.

The foregoing is illustrative only and is not intended to be in any way limiting. In addition to the illustrative embodiments and features described above, further embodiments and features will become apparent by reference to the drawings and the following detailed description.

BRIEF DESCRIPTION OF THE DRAWINGS

A more complete appreciation of the invention will become more apparent by describing in detail embodiments thereof with reference to the accompanying drawings, where.

DETAILED DESCRIPTION

Figure 1:
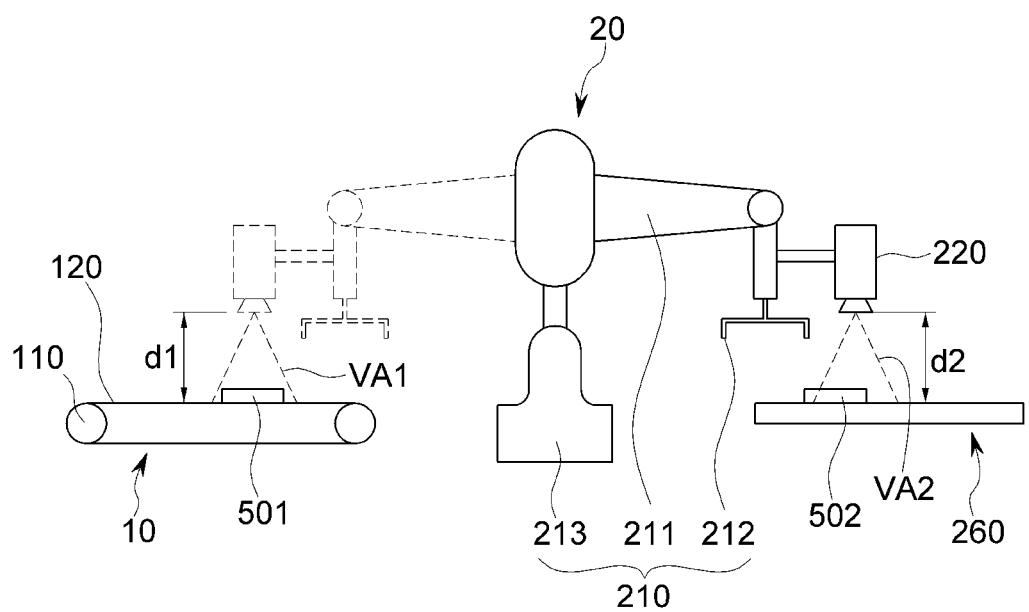
FIG. 1 is a cross-sectional view illustrating an embodiment of a substrate transferring system.

Embodiments will now be described more fully hereinafter with reference to the accompanying drawings. Although the invention may be modified in various manners and have several embodiments, embodiments are illustrated in the accompanying drawings and will be mainly described in the specification. However, the scope of the invention is not limited to the embodiments and should be construed as including all the changes, equivalents and substitutions included in the spirit and scope of the invention.

In the drawings, thicknesses of a plurality of layers and areas are illustrated in an enlarged manner for clarity and ease of description thereof. When a layer, area, or plate is referred to as being related to another element such as being "on" another layer, area, or plate, it may be directly on the other layer, area, or plate, or intervening layers, areas, or plates may be present therebetween. Conversely, when a layer, area, or plate is referred to as being related to another element such as being "directly on" another layer, area, or plate, intervening layers, areas, or plates may be absent therebetween. Further when a layer, area, or plate is referred to as being related to another element such as being "below" another layer, area, or plate, it may be directly below the other layer, area, or plate, or intervening layers, areas, or plates may be present therebetween. Conversely, when a layer, area, or plate is referred to as being related to another element such as being "directly below" another layer, area, or plate, intervening layers, areas, or plates may be absent therebetween.

The spatially relative terms "below," "beneath," "lower," "above," "upper" and the like, may be used herein for ease of description to describe the relations between one element or component and another element or component as illustrated in the drawings. It will be understood that the spatially relative terms are intended to encompass different orientations of the device in use or operation, in addition to the orientation illustrated in the drawings. For example, in the case where a device illustrated in the drawing is turned over, the device positioned "below" or "beneath" another device may be disposed "above" another device. Accordingly, the illustrative term "below" may include both the lower and upper positions. The device may also be oriented in the other direction and thus the spatially relative terms may be interpreted differently depending on the orientations.

Throughout the specification, when an element is referred to as being "connected" to another element, the element is "physically connected" to the other element, or "electrically connected" to the other element with one or more intervening elements therebetween. The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" may be termed likewise without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, or 5% of the stated value.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined at the present specification.

Some of the parts which are not associated with the description may not be provided in order to specifically describe embodiments of the invention and like reference numerals refer to like elements throughout the specification.

Figure 2:
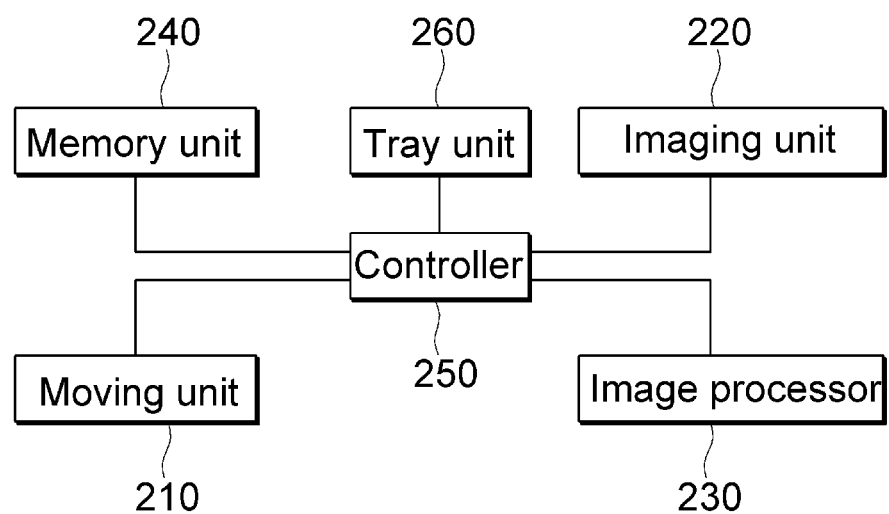
FIG. 2 is a block diagram illustrating an embodiment of a substrate transferring system.
Figure 3:
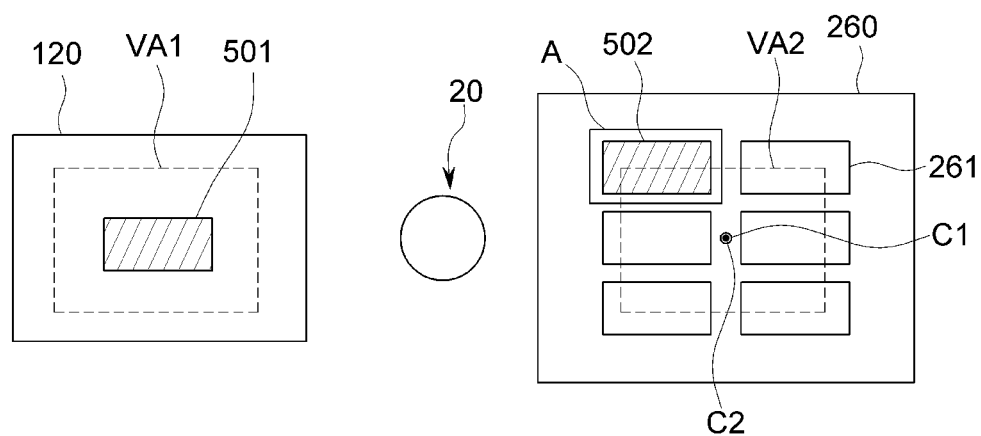
FIG. 3 is a top plan view of the substrate transferring system of FIG. 1.

FIG. 1 is a cross-sectional view illustrating an embodiment of a substrate transferring system, FIG. 2 is a block diagram illustrating an embodiment of a substrate transferring system, and FIG. 3 is a top plan view of the system of FIG. 1.

Referring to FIG. 1, a substrate 501 as an object to be transferred is loaded to a transferring unit 10 and transferred by the transferring unit 10 toward a substrate transferring system 20 to become a transferred substrate 502. As applicable to an entirety of the present disclosure, the transferring unit 10 may otherwise be referred to as a substrate transporter.

The transferring unit 10 and the substrate transferring system 20, and components thereof, may be extended along a first direction D1 and a second direction D2 which cross each other. A thickness of the transferring unit 10 and the substrate transferring system 20, and components thereof, is extended along a third direction crossing each of the first direction D1 and the second direction D2. In FIG. 1, the vertical direction represents the third direction, while the horizontal direction and a direction into the page view may variously represent the first direction D1, the second direction D2 and/or a direction within a plane defined by the first direction D1 and the second direction D2 which forms an angle therewith.

The transferring unit 10 is an apparatus with which an object is transferred from a first location to a different location. In an embodiment, for example, the transferring unit 10 may include a moving body 110 and a conveyor belt 120 which is engaged with the moving body 110. Actuation of the moving body 110 moves the conveyor belt 120 about the moving body 110, such that an object on the conveyor belt 120 moves together therewith. However, embodiments are not limited thereto, and the transferring unit 10 may include various configuration which transfer or transport objects along a predetermined direction.

The transferring unit 10 includes a first imaging area VA1 at which an image is captured by an imaging unit 220 to be described below. As applicable to an entirety of the present disclosure, the image captured at the first imaging area VA1 may be referred to as a first image. The first imaging area VA1 may have a planar area substantially equal to a planar area of a second imaging area VA2 to be described below.

Referring to FIGS. 1 and 2, the substrate transferring system 20 includes a moving unit 210, an imaging unit 220, an image processor 230, a memory unit 240, a controller 250, and a tray unit 260. The controller 250 may be connected to and communicate with each of the moving unit 210, the imaging unit 220, the image processor 230, the memory unit 240 and the tray unit 260, such that signals, images, reference values, etc. may be transmitted among components of the substrate transferring system 20, as described below. As applicable to an entirety of the present disclosure, the moving unit 210, the imaging unit 220, the memory unit 240, and the tray unit 260 may otherwise be referred to as a substrate mover, an imager, memory and a tray, respectively.

In an exemplary embodiment, the substrate transferring system 20 is implemented by a computer processing system including at least a computer processor, logic and internal/external memory or storage. The computer processing system may further include any of a number of input and/or output devices. While FIG. 1 illustrates the substrate transferring system 20 as a single or integral group of components, it should be understood by one skilled in the art that the substrate transferring system 20 may be implemented by a plurality of a computer processing system and/or a plurality of a computer processor. The components of the substrate transferring system 20 may communicate with each other by various networks or communication methods known in the art.

One or more embodiment of the invention can be written as computer programs or algorithms, and can be implemented in general-use digital computers or computer processor, that execute the programs using a computer readable recording medium. It should be understood by one skilled in the art, that the general-use computer executes the computer programs and includes, but is not limited to, a personal computer such as a lap top or a personal digital assistant. A portion of the elements and functions of the invention may be implemented by the computer processor, e.g., by providing an applet to the computer processor. The computer readable recording medium includes, but is not limited to, magnetic storage media (e.g., read-only memory ("ROM"), floppy disks, hard disks, etc.), optical recording media (e.g., compact disk read-only memory ("CD-ROMs"), or digital versatile/digital video disc ("DVDs")), and storage media such as carrier waves (e.g., transmission through the Internet). Memory may be contained in a computer processor or may be a separate physical device. Information stored in the memory retrieved and manipulated via the computer processor. Access control with respect to the data stored in the memory may be managed via an authentication mechanism (e.g., firewall) configured by the computer processor to create and manage the invention described herein.

The moving unit 210 is an apparatus with which an object is transported or transferred between the transferring unit 10 and the tray unit 260. In an embodiment, for example, the moving unit 210 may include an arm portion 211, a substrate securing portion 212 and a support portion 213. In an exemplary embodiment, the moving unit 210 may be a robot.

The arm portion 211 may revolve between the transferring unit 10 and the tray unit 260. To this end, the arm portion 211 may have a plurality of joints, and may include a motor which drives the joints. However, embodiments are not limited thereto.

The substrate securing portion 212 may move together with the arm portion 211. The substrate securing portion 212 may secure a position of the object within the substrate transferring system 20 to move together with the object, between the transferring unit 10 and the tray unit 260. The substrate securing portion 212 may extend from the arm portion 211. However, embodiments are not limited thereto, and the substrate securing portion 212 may extend from the support portion 213 to be described below.

The support portion 213 may support the arm portion 211 and the substrate securing portion 212, and may be connected to the arm portion 211 and the substrate securing portion 212.

The support portion 213 may be a rotary shaft to provide revolving movement of the arm portion 211 about an axis. Rotation of the support portion 213 moves the arm portion 211 together with the substrate securing portion 212.

The imaging unit 220 may be disposed at an end portion of the moving unit 210. Specifically, the imaging unit 220 may be disposed at an end portion of the arm portion 211. Rotation of the support portion 213 moves the imaging unit 220 coupled to the arm portion 211. Accordingly, the imaging unit 220 may move in a revolving manner together with the moving unit 210. That is, since the imaging unit 220 may move together with the moving unit 210, a same one of the imaging unit 220 according to an embodiment may capture images of the object located at different positions.

The imaging unit 220 captures images of the object that is disposed on the transferring unit 10 and the transferred substrate 502 that is disposed on the tray unit 260. The imaging unit 220 may be an optical device. In an embodiment, for example, the imaging unit 220 may be a charge-coupled device ("CCD") camera or a complimentary metal-oxide semiconductor ("CMOS") camera.

The imaging unit 220 may capture images with a constant focus. That is, a focus of the imaging unit 220 may not change. Since the imaging unit 220 that has a fixed focus has a relatively lower price as compared with an imaging unit 220 having a changing focus, the cost for manufacturing display devices may be reduced accordingly.

A distance d1 along the third direction between the transferring unit 10 and the imaging unit 220 when the imaging unit 220 captures an image of the first imaging area VA1 is substantially equal to a distance d2 along the third direction between the tray unit 260 and the imaging unit 220 when the imaging unit 220 captures an image of the second imaging area VA2. As applicable to an entirety of the present disclosure, the image captured at the second imaging area VA2 may be referred to as a second image. More specifically, referring to FIG. 1, the distance d1 between the transferring unit 10 and the imaging unit 220 when the imaging unit 220 captures an image of the substrate 501 disposed on the transferring unit 10 is substantially equal to the distance d2 between the tray unit 260 and the imaging unit 220 when the imaging unit 220 captures an image of the transferred substrate 502 disposed on the tray unit 260.

Since the focus of the imaging unit 220 is kept constant and since the distance d1 between the transferring unit 10 and the imaging unit 220 when the imaging unit 220 captures an image of the first imaging area VA1 is substantially equal to the distance d2 between the tray unit 260 and the imaging unit 220 when the imaging unit 220 captures an image of the second imaging area VA2, the first imaging area VA1 may have a planar area substantially equal to a planar area of the second imaging area VA2.

Referring to FIG. 1 and FIG. 2, for example, the image processor 230 of the substrate transferring system 20 analyzes the image that is captured by the imaging unit 220, determines a position of the transferred substrate 502 disposed on the tray unit 260 and whether the transferred substrate 502 disposed on the tray unit 260 is positioned in place (e.g., positioned at a correct position), and generates and outputs a position signal about the position of the transferred substrate 502. In specific, the image processor 230 may include a storing portion such as memory storage which stores a reference value for determining whether the transferred substrate 502, located on the tray unit 260, is positioned in place. The image processor 230 will be described below in detail with reference to FIGS. 8 to 16.

The memory unit 240 may store the image captured by the imaging unit 220, such that the substrate transferring system 20 may analyze the image captured by the imaging unit 220.

The controller 250 may receive the position signal output by the image processor 230. According to the position signal, the controller 250 may generate and output a movement signal to the moving unit 210 to control movement of the moving unit 210.

In addition, the controller 250 may generate and output an imaging signal to the imaging unit 220 according to the position of the moving unit 210. The imaging signal may control the imaging unit 220 to capture an image, without being limited thereto.

Referring again to FIG. 1, the transferred substrate 502 transferred from the transferring unit 10 may be disposed at the tray unit 260. The tray unit 260 includes a substrate accommodation portion (261 in FIG. 3) provided in plurality where the transferred substrate 502 is located.

The tray unit 260 includes the second imaging area VA2 that is a planar area to be captured as an image by the imaging unit 220. At least a portion of the transferred substrate 502 disposed on the tray unit 260 may be disposed in the second imaging area VA2, and at least a portion of each substrate accommodation portion 261 may be disposed in the second imaging area VA2. The substrate accommodation portion 261 may be a planar area among a total planar area of the tray unit 260, at which a portion or an entirety of the transferred substrate 502 is disposed.

The second imaging area VA2 has a planar area less than a total planar area of the tray unit 260. That is, the second imaging area VA2 may not include an entire surface of the tray unit 260. Accordingly, at least a portion of the transferred substrate 502 disposed at the tray unit 260 may be disposed at the second imaging area VA2.

The second imaging area VA2 may have a planar area substantially equal to a planar area of the first imaging area VA1. A center C1 of the tray unit 260 may overlap and/or coincide with a center C2 of the second imaging area VA2.

Figure 4:
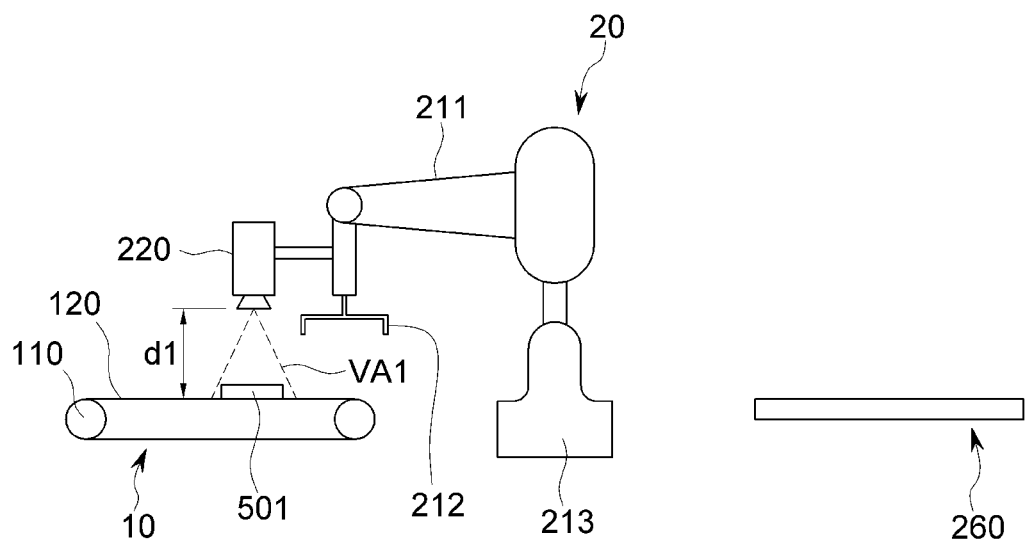
FIGS. 4 to 6 are cross-sectional views illustrating an embodiment of a method for transferring a substrate.
Figure 5:
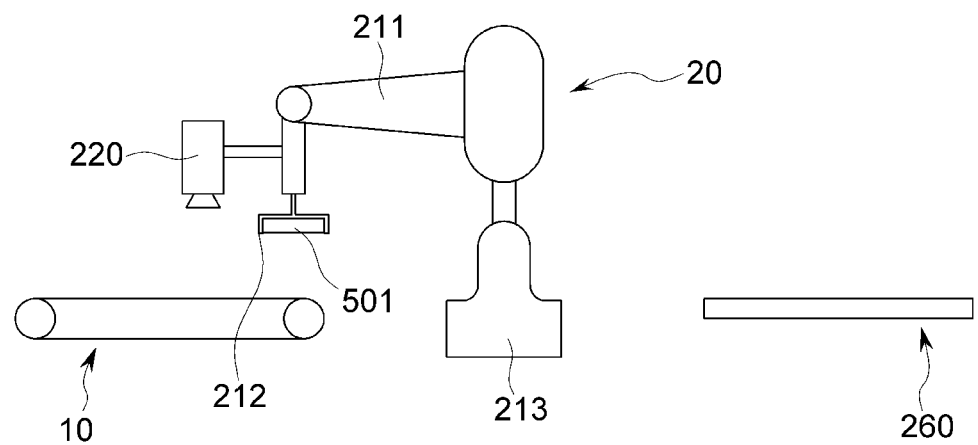
Figure 6:
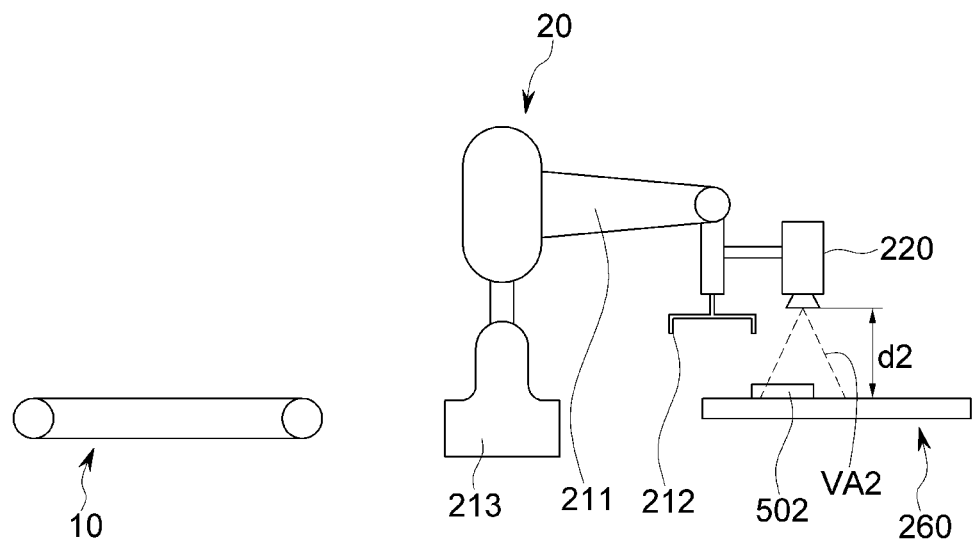

FIGS. 4 to 6 are cross-sectional views illustrating an embodiment of a method for transferring a substrate.

The substrate 501 is disposed at the transferring unit 10, and transferred toward the substrate transferring system 20 by the transferring unit 10. Specifically, the substrate 501 is disposed on the transferring unit 10, and is transferred toward the moving unit 210 of the substrate transferring system 20, by the transferring unit 10. Actuation of the transferring unit 10 moves the substrate 501 from a starting position at a distance from the moving unit 210, to a position which is closer to the moving unit 210.

Referring to FIG. 4, the substrate 501 that has been transferred in a left-to-right direction is captured as an image by the imaging unit 220. In an embodiment, for example, the substrate 501 is transferred to a position adjacent to the moving unit 210, and specifically, one of the substrate 501 is disposed in the first imaging area VA1. A planar area of the first imaging area VA1 may correspond to a planar area of the substrate 501. In an embodiment, the planar area of the first imaging area VA1 may be equal to or greater than the planar area of the substrate 501, such that an entirety of the substrate 501 is disposed within the first imaging area VA1.

The arm portion 211 and the imaging unit 220 of the moving unit 210 are positioned on the transferring unit 10, and the imaging unit 220 captures an image of one of the substrate 501 and at least a portion of the transferring unit 10 that are positioned in the first imaging area VA1. The image processor 230 of the substrate transferring system 20 analyzes the image captured by the imaging unit 220, and outputs a position signal about a position of the substrate 501 positioned on the transferring unit 10. The image processor 230 may generate the position signal, without being limited thereto.

Referring to FIG. 2, the controller 250 of the substrate transferring system 20 receives the position signal output from the image processor 230. As described above, the controller 250 may receive the position signal output by the image processor 230, and may generate and output a movement signal based on the position signal, to the moving unit 210 to control movement of the moving unit 210. Input of the movement signal to the moving unit 210 moves the moving unit 210 to the position of the substrate 501.

Referring to FIG. 5, movement of the moving unit 210 disposes the substrate securing portion 212 at the position of the substrate 501, and the substrate 501 is secured to the substrate securing portion 212 in order to transfer the substrate 501 to the tray unit 260. While the arm portion 211 is disposed at the transferring unit 10, the movement of the moving unit 210 may move the imaging unit 220, which is disposed at the substrate 501 (FIG. 4), away from the substrate 501 and move the substrate securing portion 212 to the position of the substrate 501 (FIG. 5).

As illustrated in FIG. 6, the arm portion 211, the imaging unit 220 and the substrate securing portion 212 having the substrate 501 attached thereto, together move from the transferring unit 10 toward the tray unit 260. The substrate 501 attached to the substrate securing portion 212 at the transferring unit 10 may be detached from the substrate securing portion 212 once the substrate 501 is positioned at the tray unit 260. The substrate 501 detached from the substrate securing portion 212 is disposed on the tray unit 260 as the transferred substrate 502. While the arm portion 211 is disposed at the tray unit 260, the movement of the moving unit 210 may move the substrate securing portion 212 from which the substrate 501 has be detached, away from the transferred substrate 502 on the tray unit 260, and move the imaging unit 220 to the position of the transferred substrate 502.

While the transferred substrate 502 is disposed on the tray unit 260, the imaging unit 220 captures an image of the second imaging area VA2. In an embodiment, for example, the imaging unit 220 captures an image of at least a portion of the tray unit 260 and at least a portion of the transferred substrate 502 that are located in the second imaging area VA2, to check whether the transferred substrate 502 is positioned at a correct position in the tray unit 260. In such an embodiment, the distance d2 between the tray unit 260 and the imaging unit 220 is substantially equal to the distance d1 (FIG. 4) between the transferring unit 10 and the imaging unit 220.

A portion of a single of the transferred substrate 502 may be located in the second imaging area VA2, without being limited thereto. In an embodiment, taking FIG. 3 and FIG. 6 together, more than one of the transferred substrate 502 may be disposed in the second imaging area VA2, while a portion of each one of the transferred substrate 502 is located in the second imaging area VA2. The arm portion 211 and the imaging unit 220 of the moving unit 210 are positioned at the tray unit 260, and the imaging unit 220 captures an image of a portion of each one of the transferred substrate 502 which is located in the second imaging area VA2. In one or more embodiments, since the imaging unit 220 maintains a constant focus, a portion of each one of the transferred substrate 502 disposed on the tray unit 260 may be located in the second imaging area VA2. As such, the captured image of the tray unit 260 at which the more than one of the transferred substrate 502 is disposed may include an image of only a portion of each one of the transferred substrate 502. That is, a same one of the captured image of the tray unit 260 at which more than one of the transferred substrate 502 is disposed may not include an entire image of each one of the transferred substrate 502. However, embodiments are not limited thereto, and a same one of the image of the tray unit 260 at which the more than one of the transferred substrate 502 is disposed may include an image of an entirety of each one of the transferred substrate 502.

As described above, the substrate transferring system 20 analyzes the captured image to check whether or not the transferred substrate 502 is positioned in place, which will be described in detail with reference to FIGS. 7 to 16.

Figure 7:
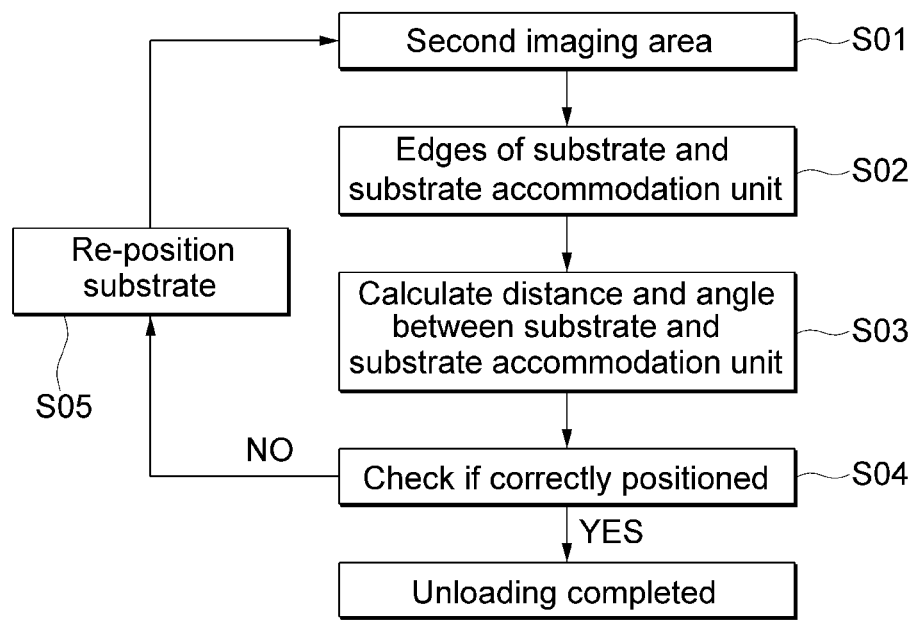
FIG. 7 is a flowchart illustrating an embodiment of an algorithm for determining whether a substrate is positioned in place.
Figure 8:
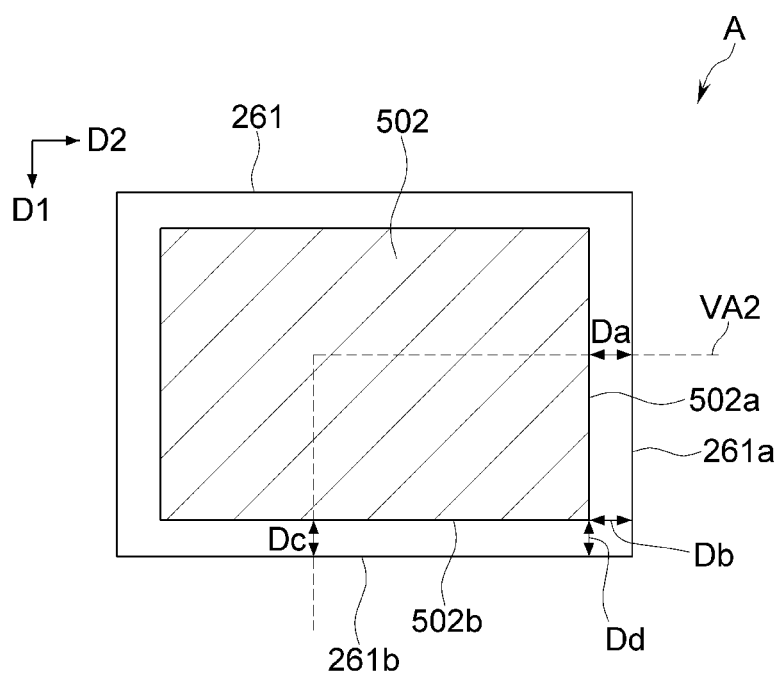
FIG. 8 is an enlarged top plan view of portion A of FIG. 3.

FIG. 7 is a flowchart illustrating an embodiment of an algorithm for determining whether a substrate is positioned in place, FIG. 8 is an enlarged to plan view of portion A of FIG. 3, and FIGS. 9 to 16 are top plan views illustrating various arrangement of a substrate which is not correctly positioned in place.

The transferred substrate 502 is disposed adjacent to the substrate accommodation portion 261 on the tray unit 260, and the imaging unit 220 captures an image of the second imaging area VA2 (S01). Specifically, the imaging unit 220 may capture an image of at least a portion of the tray unit 260 located in the second imaging area VA2 together with a portion of the transferred substrate 502 disposed at the tray unit 260. Accordingly, the image captured by the imaging unit 220 may include an image of at least a portion of the tray unit 260 together with an image of a portion of the transferred substrate 502 disposed at the tray unit 260.

The image processor 230 recognizes at least two sides of each transferred substrate 502 (e.g., a first side 502a and a second side 502b) and at least two sides of the substrate accommodation portion 261 of the tray unit 260 (e.g., a first side 261a and a second side 261b) from the captured image (S02).

While the transferred substrate 502 is disposed relative to the substrate accommodation portion 261 within the image captured at the second imaging area VA2, the image processor 230 may calculate various distances and an angle formed between the transferred substrate 502 and the substrate accommodation portion 261 (S03). These distances and angle may be respectively considered a value of a dimension between the transferred substrate 502 and the substrate accommodation portion 261. In an embodiment, first, second, third, and fourth distances Da, Db, Dc, and Dd between corresponding facing sides among two sides of the transferred substrate 502 and the two sides of the substrate accommodation portion 261, respectively. As illustrated in FIG. 8, for example, the first side 502a of the transferred substrate 502 is extends along the first direction D1 and located facing the first side 261a of the substrate accommodation portion 261 which extends along the first direction D1, based on the image captured at the second imaging area VA2. The two sides of each transferred substrate 502 and the substrate accommodation portion 261 may be sides respectively adjacent to each other, without being limited thereto.

Two end portions of the first side 261a are disposed opposing each other along the first direction D1. Along a length of the first side 261a (e.g., along the first direction D1), between the two end portions thereof, distances along the second direction D2 are calculated between various corresponding coordinates of the substrate accommodation portion 261 and the transferred substrate. Among these calculated distances, first and second distances Da and Db are shortest distances between the two end portions of the first side 261a of the substrate accommodation portion 261 and the first side 502a of the transferred substrate 502 are determined.

Referring to FIG. 3 together with FIG. 8, within a same one of the second image, a substrate accommodation portion 261 is disposed relative to a transferred substrate 502 corresponding thereto. The substrate accommodation portion 261 disposed relative to the transferred substrate 502 disposes the first side 261a and the second side 261b of the substrate accommodation portion 261 facing the first side 502a and the second side 502b of the transferred substrate 502, respectively, the first side 261a of the substrate accommodation portion having two end portions opposing each other. The substrate accommodation portion 261 disposed relative to the transferred substrate 502 also disposes the first side 261a of the substrate accommodation portion 261 spaced apart from the first side 502a of the transferred substrate 502 by the first distance D1 and the second distance D2 respectively at different points along the first side 261a of the substrate accommodation portion 261 and between the two end portions thereof. The substrate accommodation portion 261 disposed relative to the transferred substrate 502 also disposes the first side 261a of the substrate accommodation portion 261 and the second side 502b of the transferred substrate 502 at an angle relative to each other.

Similarly, two end portions of the second side 261b are disposed opposing each other along the second direction D2. Along a length of the second side 261b (e.g., along the second direction D2), between the two end portions thereof, distances along the first direction D1 are calculated between various corresponding coordinates of the substrate accommodation portion 261 and the transferred substrate 502. Among these calculated distances, third and fourth distances Dc and Dd are shortest distances between the two end portions of the second side 261b of the substrate accommodation portion 261 and the second side 502b of the transferred substrate 502.

In addition, the image processor 230 may calculate an angle between the first side 261a of the substrate accommodation portion 261 and the second side 502b of the transferred substrate 502.

The first, second, third, and fourth distances Da, Db, Dc and Dd are compared with a first reference value (Ref1) and a second reference value (Ref2). In an embodiment, for example, the first reference value (Ref1) may be greater than the second reference value (Ref2), the first reference value (Ref1) may be about 0.5 millimeter (mm), and the second reference value (Ref2) may be about −0.5 mm. Accordingly, it is possible to determine whether the transferred substrate 502 is disposed spaced apart from the two sides of the substrate accommodation portion 261 by a distance greater than or substantially equal to the first reference value (Ref1) and the second reference value (Ref2). In addition, an angle θ between the first side 261a of the substrate accommodation portion 261 and the second side 502b of the transferred substrate 502 is compared with a reference angle, such as 90 degrees.

Accordingly, it is possible to determine whether the transferred substrate 502 is positioned at an incorrect position (S04). In specific, examples of the transferred substrate 502 not correctly positioned are detailed in Table 1 below.

TABLE 1

| | Conditions (satisfying distance and angle) | |
|---|---|---|
| | Distance | Angle (θ) |
| (1) | Da > Ref1, Db > Ref1 | θ = 90° |
| (2) | Da < Ref2, Db < Ref2 | θ = 90° |
| (3) | Dc > Ref1, Dd > Ref1 | θ = 90° |
| (4) | Dc < Ref2, Dd < Ref2 | θ = 90° |
| (5) | Ref2 < Da < Ref1, Db < Ref2 | θ < 90° |
| (6) | Incapable of measuring two sides of the substrate accommodation portion | θ < 90° |
| (7) | Da < Ref2, Ref2 < Db < Ref1 | θ > 90° |
| (8) | Incapable of measuring two sides of the substrate accommodation portion | θ > 90° |

Figure 9:
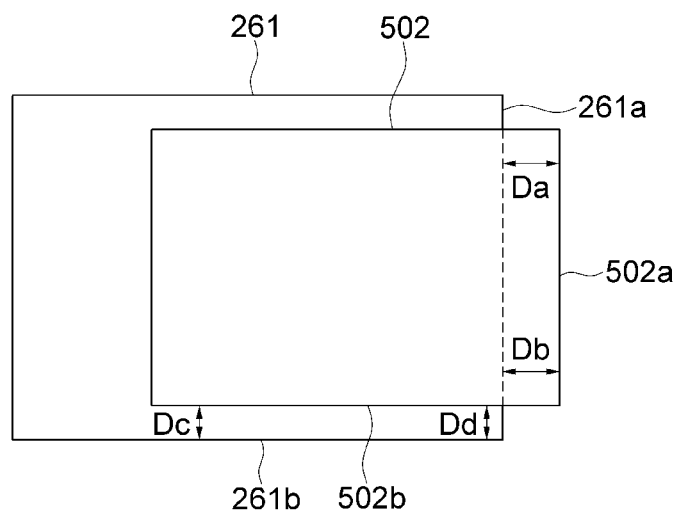
FIGS. 9 to 16 are top plan views illustrating various arrangements of a substrate which is not correctly positioned in place.

Referring to FIG. 9, since the transferred substrate 502 is disposed to cover at least a portion of the first side 261a of the substrate accommodation portion 261, and the first side 502a and the second side 502b of the transferred substrate 502 are disposed parallel to the first side 261a and the second side 261b of the substrate accommodation portion 261, respectively, it is determined that the substrate is not positioned in place (e.g., is not at a correct position).

Related to FIG. 9, the image processor 230 may calculate the first and second distances Da and Db based on the image captured at the second imaging area VA2, and may calculate the angle θ between the first side 261a of the substrate accommodation portion 261 and the second side 502b of the transferred substrate 502. In such an embodiment, each of the first and second distances Da and Db may be greater than the first reference value (Ref1), and the angle θ between the first side 261a of the substrate accommodation portion 261 and the second side 502b of the transferred substrate 502 may be about 90 degrees. Accordingly, the image processor 230 may determine that the case of FIG. 9 corresponds to the (1) of Table 1.

Figure 10:
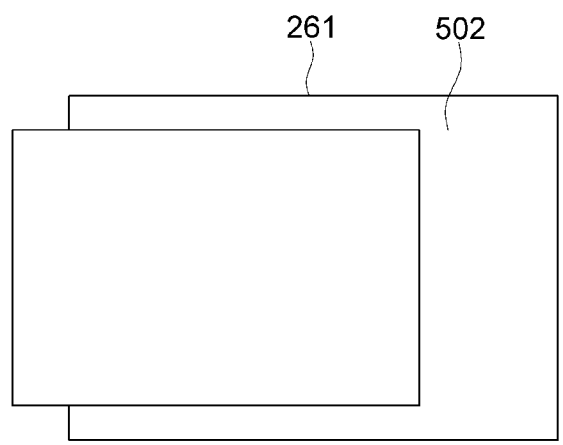
Figure 11:
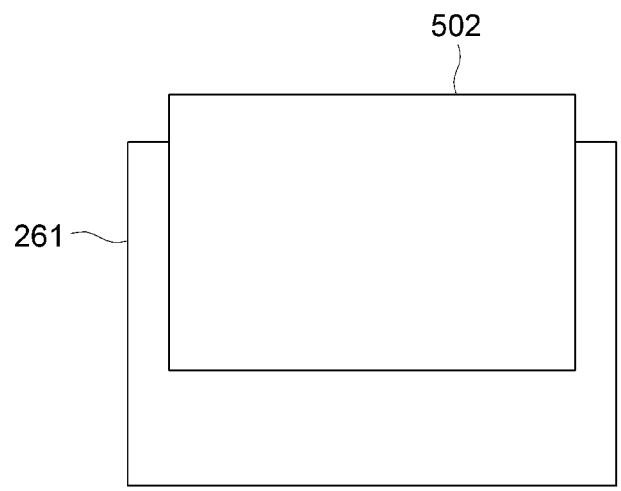
Figure 12:
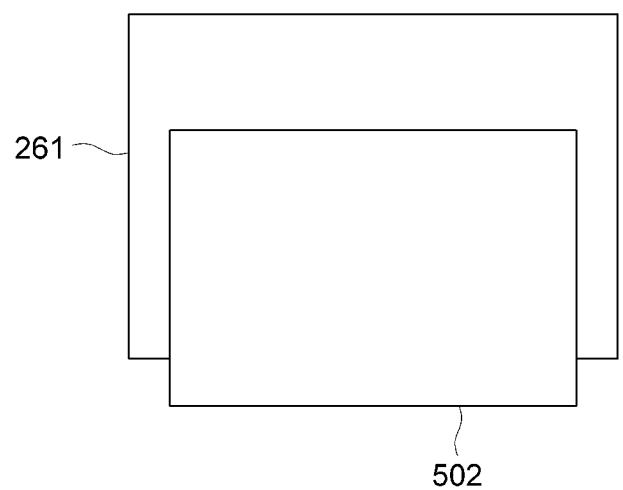
Figure 13:
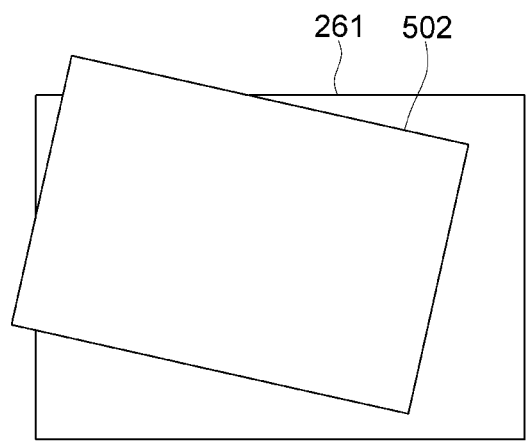
Figure 14:
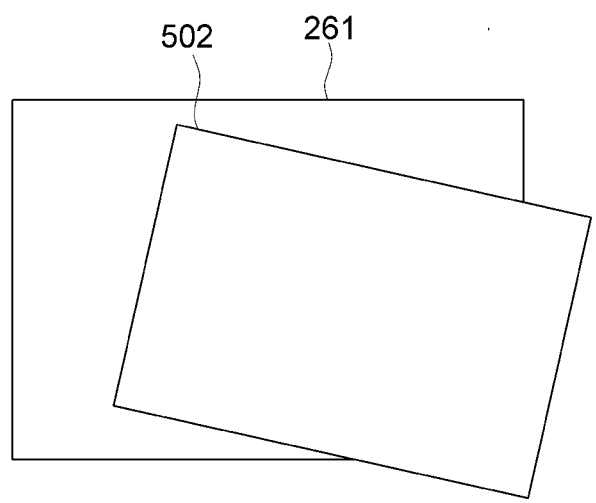
Figure 15:
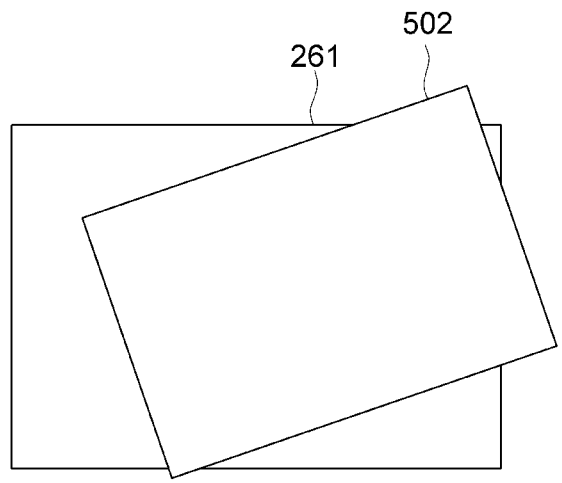
Figure 16:
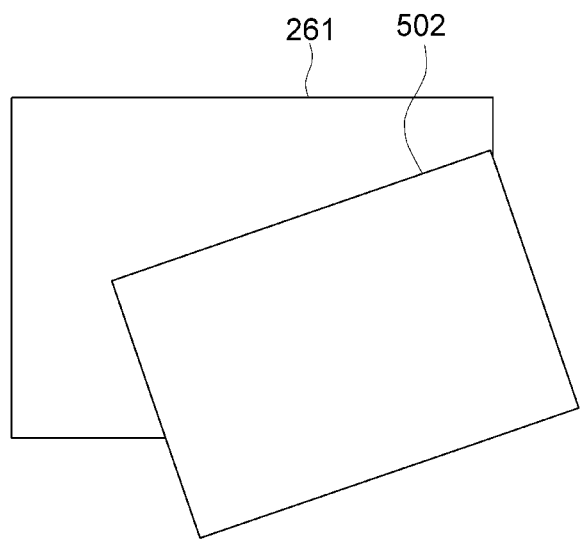

Similar to the description above, the image processor 230 may calculate various distances among the first, second, third, and fourth distances Da, Db, Dc and Dd and may calculate the angle θ to determine that the arrangement of FIG. 10 corresponds to (2) of Table 1, the arrangement of FIG. 11 corresponds to (3) of Table 1, the arrangement of FIG. 12 corresponds to (4) of Table 1, the arrangement of FIG. 13 corresponds to (5) of Table 1, the arrangement of FIG. 14 corresponds to (6) of Table 1, the arrangement of FIG. 15 corresponds to (7) of Table 1, and the arrangement of FIG. 16 corresponds to (8) of Table 1.

When it is determined that the transferred substrate 502 is not positioned in place (e.g., is not at a correct position), the orientation or position of the transferred substrate 502 relative may be corrected based on the calculated first, second, third, and fourth distances and angles (S05). In an embodiment, correcting the orientation or position of the transferred substrate 502 may include the moving unit 210, such as using the substrate securing portion 212, to re-position the transferred substrate 502 relative to the tray unit 260, without being limited thereto.

When it is determined that the transferred substrate 502 is positioned in place (e.g., is at a correct position) on the tray unit 260, the transferred substrate 502 may be unloaded from the system. In an embodiment, completing the unloading of the transferred substrate 502 may include the moving unit 210, such as using the substrate securing portion 212, to unload the transferred substrate 502 from the tray unit 260, without being limited thereto.

As set forth hereinabove, according to one or more embodiments of the invention, the manufacturing cost of the display device may be reduced.

While the invention has been illustrated and described with reference to the embodiments thereof, it will be apparent to those of ordinary skill in the art that various changes in form and detail may be made thereto without departing from the spirit and scope of the invention.

What is claimed is:

1. A system for transferring a substrate, the system comprising:
    a substrate transporter at which a first image is captured with which a position of the substrate at the substrate transporter is determined;
    a tray to which a plurality of substrates is moved from the substrate transporter and at which a second image is captured with which a position of each of the plurality of substrates relative to the tray is determined;
    a substrate mover with which the substrate is movable in a revolving manner between the substrate transporter and the tray, the substrate mover comprising:
        an arm portion movable in the revolving manner between the substrate transporter and the tray, and
        a substrate securing portion movable together with the arm portion and to which the substrate is securable; and
    an imager with which the first image and the second image are captured, the imager connected to the arm portion and movable in the revolving manner between the substrate transporter and the tray together with the arm portion,
    wherein the tray includes an imaging area at which the plurality of substrates is disposed and at which the second image is captured by the imager, the second image including a portion of each of the plurality of substrates disposed relative to the tray.

2. The system of claim 1, wherein
    the substrate transporter includes a first imaging area at which the substrate is disposed and at which the first image is captured by the imager, the first image including the substrate disposed relative to the substrate transporter
    the imaging area of the tray defines a second imaging area, and
    a planar area of the second imaging area is less than a planar area of the tray.

3. The system of claim 2, wherein a center of the second imaging area overlaps a center of the tray.

4. The system of claim 2, wherein a planar area of the first imaging area is equal to a planar area of the second imaging area.

5. The system of claim 1, wherein the imager maintains a constant focus.

6. The system of claim 2, wherein
    capture of the first image at the first imaging area by the imager, disposes the substrate transporter and the imager at a first distance from each other,
    capture of the second image at the second imaging area by the imager, disposes the tray and the imager at a second distance from each other, and
    the first distance is equal to the second distance.

7. The system of claim 2, wherein
    the tray comprises a plurality of substrate accommodation portions respectively at which the plurality of substrates is disposed,
    a portion of each of the plurality of substrate accommodation portions is disposed at the second imaging area, and
    the second image includes the portion of each of the plurality of substrate accommodation portions at the second imaging area disposed relative to a corresponding portion of the plurality of substrates, respectively.

8. The system of claim 7, wherein within the second image, a substrate accommodation portion among the plurality of substrate accommodation portions disposed relative to a corresponding substrate among the plurality of substrates:
    disposes a first side and a second side of the substrate accommodation portion facing a first side and a second side of the corresponding substrate, respectively, the first side of the substrate accommodation portion having two end portions opposing each other,
    disposes the first side of the substrate accommodation portion spaced apart from the first side of the corresponding substrate by a first distance and a second distance respectively at different points along the first side of the substrate accommodation portion and between the two end portions thereof, and
    disposes the first side of the substrate accommodation portion and the second side of the corresponding substrate at an angle relative to each other.

9. The system of claim 8, wherein within the second image, the substrate accommodation portion disposed relative to the corresponding substrate further disposes the second side of the substrate accommodation portion spaced apart from the second side of the corresponding substrate by a third distance and a fourth distance respectively at different points along the second side of the substrate accommodation portion and between two end portions thereof.

10. The system of claim 9, wherein the first, second, third, and fourth distances and the angle, at which the substrate accommodation portion is disposed relative to the corresponding substrate within the second image, determines whether the corresponding substrate is positioned at a correct position relative to the substrate accommodation portion.

* * * * *